United States Patent [19]

Mathieson

[11] Patent Number: 5,343,135
[45] Date of Patent: Aug. 30, 1994

[54] VOLTAGE LIMITING AND INDICATING DEVICE

[75] Inventor: Eian Mathieson, Kiama, Australia

[73] Assignee: Matson Automotive Industries Pty Ltd, Greenacre, Australia

[21] Appl. No.: 602,313

[22] Filed: Nov. 14, 1991

[30] Foreign Application Priority Data

May 20, 1988 [AU] Australia ............... P18451

[51] Int. Cl.[5] .................................. H02J 7/10
[52] U.S. Cl. ................................ 320/2; 320/25; 320/48; 340/636
[58] Field of Search .......... 320/2, 25, 26, 48; 340/636

[56] References Cited

U.S. PATENT DOCUMENTS

| | | | |
|---|---|---|---|
| 3,671,851 | 6/1972 | Harkness | 322/90 |
| 4,238,722 | 12/1980 | Ford | 320/25 |
| 4,365,241 | 12/1982 | Morishita | 340/636 |
| 4,366,430 | 12/1982 | Wright | 320/25 |
| 4,617,506 | 10/1986 | Bogie et al. | 320/2 |
| 4,701,688 | 10/1987 | Guim | 320/25 |
| 4,740,740 | 4/1988 | Taranto et al. | 320/26 |
| 4,786,851 | 11/1988 | Fuji et al. | 320/2 |
| 4,869,688 | 9/1989 | Merio | 439/504 |

FOREIGN PATENT DOCUMENTS

| | | |
|---|---|---|
| 15804/88 | 5/1988 | Australia . |
| 1098961 | 4/1981 | Canada . |
| 2842422 | 4/1980 | Fed. Rep. of Germany . |
| 2192102A | 12/1987 | United Kingdom . |
| 2192102 | 12/1987 | United Kingdom . |

*Primary Examiner*—R. J. Hickey
*Attorney, Agent, or Firm*—Townsend and Townsend Khourie and Crew

[57] ABSTRACT

A voltage monitoring and controlling device (1) adapted for attachment between a power source and a power discharge terminal, characterized in that the device includes circuit means to indicate whether the voltage level in said power source is below, or at a first predetermined minimum threshold value. The device (1) also has means (6) to detect incorrect connection polarity and means (16, 17) for the prevention of voltage surges beyond a second predetermined value from the power source.

16 Claims, 2 Drawing Sheets

VOLTAGE LIMITING AND INDICATING DEVICE

The present invention relates generally to voltage monitoring and limiting devices and more particularly relates to improvements in devices which are used for attachment to power circuits and in particular, to charging leads for charging or obtaining charge from a power source in order to limit surges in electric variables such as voltage fluctuations which can occur when current passes from a voltage source. This can occur in situations such as using the charging leads to charge the battery of a motor vehicle or to merely measure the voltage level in a power source. The invention is particularly useful when motor vehicle starting problems occur in that it will protect vehicle electronics and enable monitoring of power source voltage level.

The invention seeks to provide a device enabling the monitoring of voltage or charge level in a power source such as battery to enable the user of the charging leads to firstly ascertain correct polarity in positioning the leads on the power source terminals and secondly to enable monitoring of the voltage level in a power source battery to determine its voltage level relative to a predetermined threshold level and also to determine the voltage level in a fault battery to be recharged.

There are in existence electronic variable control devices which prevent voltage surges where electronic circuitry may be damaged by such surges and more particularly there is at least one known prior art device which is adapted for attachment to jumper leads which prevents voltage surges occurring which may damage vehicle electronics during recharging of batteries.

It has not been previously known to provide a device in this context having a system built therein allowing the facility to indicate to a user various threshold levels of a power source to enable a user to act according to the threshold level indicated. In addition, the device also has an indicating facility which enables a user to determine if the ends of the jumper leads are attached to the correct poles of the power source and in addition to this it also has the facility to limit voltage surges sometimes known as spikes which may damage vehicle electrics.

In one broad form the present invention comprises:
a voltage limiting and monitoring device adapted for detachable or fixed attachment to at least one charging lead between a power source and a power discharge point also connected to said lead or leads said device comprising:
a housing containing a monitoring and limits circuit and adapted to receive at least one power cable running between an entry and exit means in said housing,
means for holding said at least one power cable in rigid engagement with said housing, wherein when said lead or leads are connected to said power source,
a first indicating means incorporated in said circuit indicates proper interconnection between said lead or leads and said power source,
a second indicating means incorporated in said circuit indicates that voltage in or emanating from said power source exceeds a predetermined minimum operational threshold level, and a third indicating means
incorporated in said circuit to indicate that the voltage in or emanating from said power source falls below the predetermined minimum operational threshold level.

In its broadest form the present invention comprises;
a voltage monitoring and controlling device adapted for attachment to a wire or wires connected to a power source;
said device comprising means to indicate whether the voltage level in said power source is below or exceeds a predetermined minimum threshold value.

In the preferred embodiment the device also comprises means to detect incorrect connection polarity or reverse voltage conditions at the power source.

In the preferred embodiment the said indicating means comprises a series of light emitting diodes which indicate voltage levels relative to the said predetermined threshold voltage level.

In an alternative embodiment the indicating means comprise a series of noise emitters such as a buzzers which act in response to voltage levels in the voltage source relative to the predetermined voltage threshold.

In the preferred embodiment the said first indicating means comprises a circuit comprising, at least a resistor, a diode and a light emitting diode connected in series and to the power source via connectors. The said second indicating means comprises a circuit comprising at least a resistor, a light emitting diode and a transistor connected to said power source, said transistor having its turn on voltage predetermined by an associated voltage divider network.

The said third indicating means comprises a circuit comprising at least a resistor, a zener diode and a light emitting diode connected to the power source.

The circuitry within the device also comprises voltage suppression devices to provide an upper threshold voltage limit. As a typical example the limiting value of the suppression devices for a 12 volt system would be within the range 20 to 24 volts.

In the preferred embodiment the housing of the device comprises an outer hardened plastic moulded case. Inside the housing is another plastics material forming a core which houses the circuitry. The circuitry including a portion of the charging leads is embedded in the housing with the said leads travelling through the device. The charging leads pass through the inner core from an entry to an exit point in the housing.

In an alternative embodiment the device is detachably attached to the charging leads allowing the versatility of removability of the device from the leads according to user need.

The invention will now be described in more detail according to a preferred embodiment and with reference to the accompanying illustrations wherein.

Figure 1:
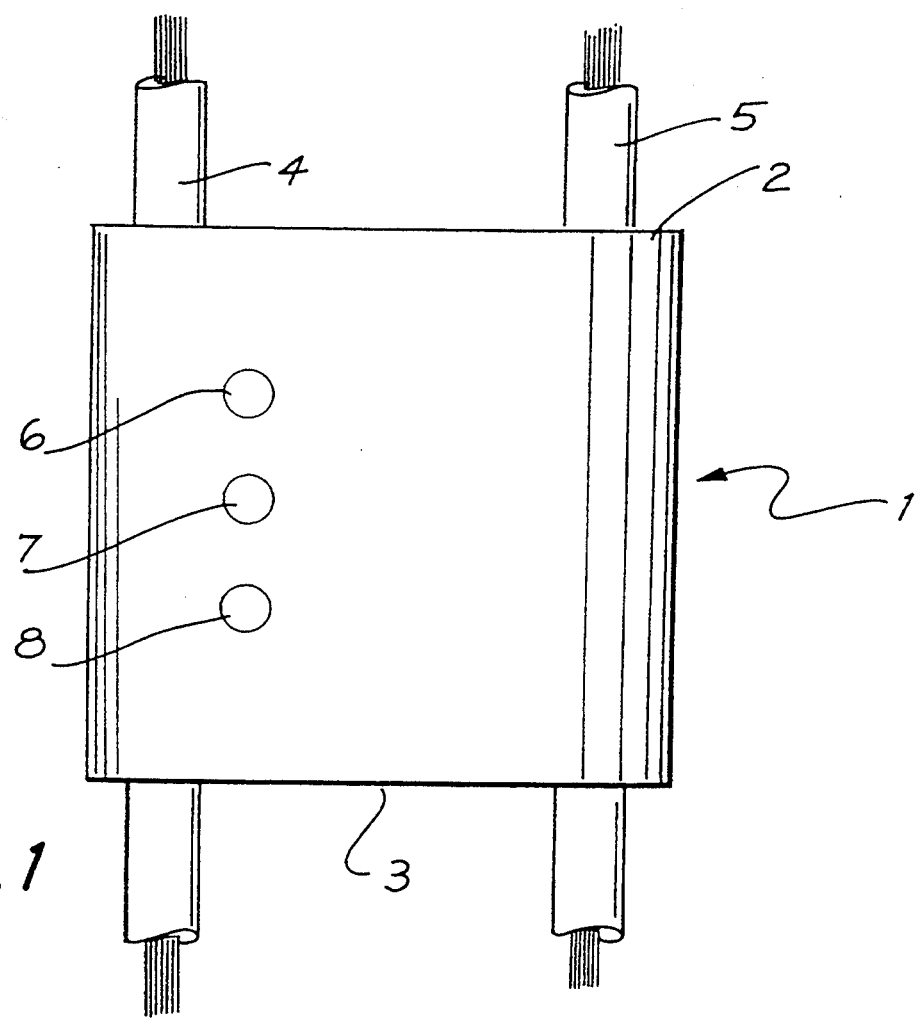
FIG. 1 shows a simple plan view of the device of the present invention according to the preferred embodiment and fitted to charging leads.
Figure 2:
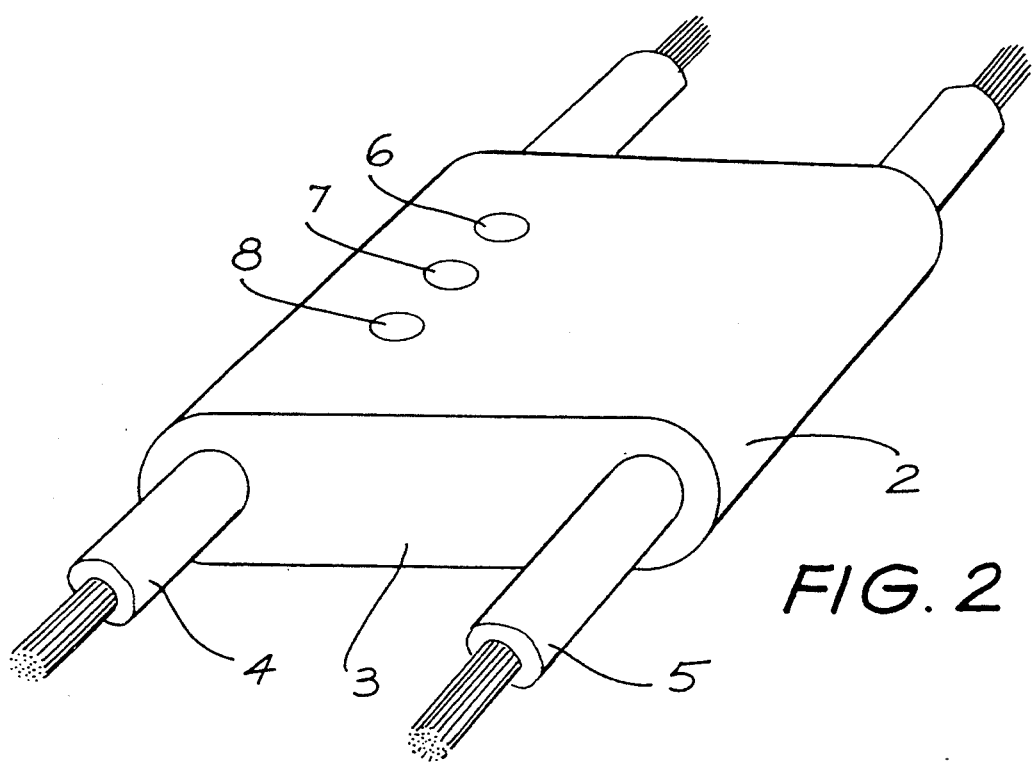
FIG. 2 shows an end elevational view of the device of FIG. 1.

Referring to FIG. 1 there is shown a plan view of a voltage monitoring and controlling device 1 of the present invention. The device preferably comprises an outer housing 2 (see FIG. 2) which encircles an inner core of plastic materials which in turn embeds a power circuit therewithin.

The plastic materials also hold and enclose positive and negative cables 4 and 5 respectively of a set of charging leads. In the preferred embodiment the device is moulded permanently around the leads 4 and 5 however, it is envisaged that the subject device 1 can be adapted for detachable fitting to and about the leads 4 and 5. The device on one hand limits the amount of voltage which will pass between the cables by means of devices such avalanche diodes. The additional facility provided by this device is, the indication to the user of the leads, the power/charge status in a power source (not shown) from which power is to be drawn. In the preferred embodiment the indication is provided by light emitting diodes which are coloured to convey appropriate warnings to a user. Alternatively, the indicia may be provided by buzzers in substitution for the LED's. The lights are shown in FIG. 1 and designated with numerals 6, 7 and 8.

Figure 3:
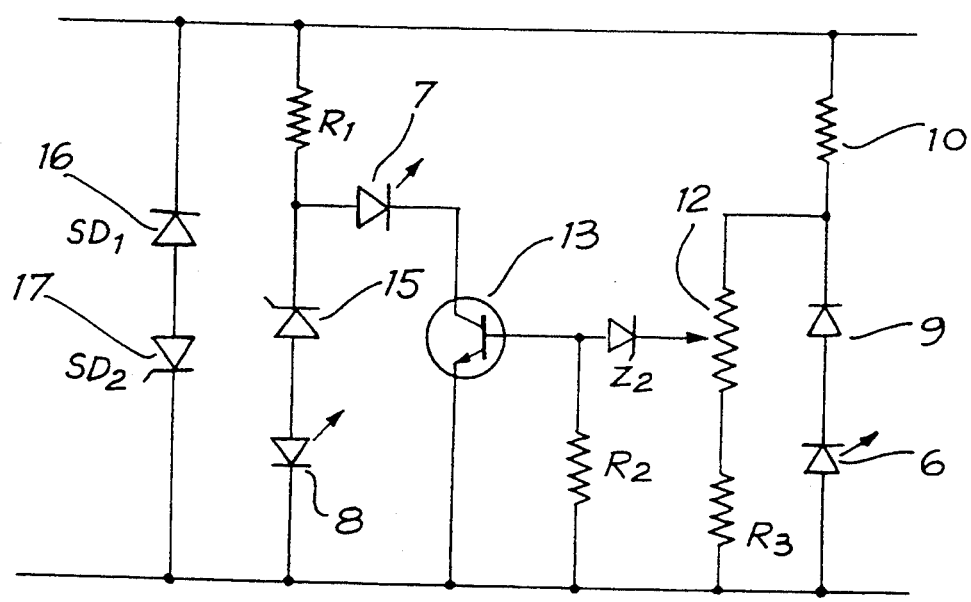
FIG. 3 shows a schematic circuit layout diagram of the device according to a preferred embodiment of the invention.

The application and use of device 1 will now be described with reference to FIG. 3 which shows a schematic circuit layout incorporating light emitting diodes (LED's) 6, 7 and 8.

In use the one end of each of leads 4 and 5 are connected to the positive and negative terminals respectively of a power source such as a vehicle ignition battery. The device has a built in warning to ensure that the leads 4 and 5 are properly connected to the battery terminal which is to provide the voltage. The warning system to indicate a reverse voltage condition comprises a series circuit comprising at least a resistor 10, a reverse blocking diode 9 and a light emitting diode 6. LED 6 indicates in conjunction with diode 9 that the polarity is incorrect. Resistor 10 acts as a current limiting device for LED 6. The value of this resistor would typically be 680 ohms for a 12 volt power source.

If reverse voltage conditions are indicated then the polarity of the leads must be reversed. A red light granted by LED 6 will indicate if polarity is incorrect. Once the leads are set in the correct position, the circuit will indicate by means of a yellow coloured LED 8 whether or not the battery being tested has a voltage level below that of a predetermined level set by means of a variable resistor 12 which typically has a value of 2 Kohms. The variable resistor or a precision resistor network also enables precise setting of the turn on voltage of the transistor 13.

LED 8 in conjunction with Zener diode 15 indicates that the voltage is below a predetermined minimum operational level. In this case a yellow light will glow. The zener diode 15 limits the turn on voltage of LED 8. The zener diode 15 has a typical value of 6V8 for approximate turn on voltage of 8 volts for a 12 volt system.

Where the voltage level in the power source is at or exceeds the predetermined level, a green coloured light glows from LED 7. Due to current blocking and provided the voltage in the transistor is at or exceeds the level set in the variable resistor 12, current will flow through the transistor 13.

In use the device, when used in conjunction with charging leads, may be used to check the voltage in a potentially faulty power source, to check a potential power source and to check the faulty battery following charging.

When the device 1 is fixed to charging leads in testing an apparently faulty or "dead" battery, where the green light glows, the indications are that the battery being tested has sufficient charge to start the vehicle. If the green light does not extinguish upon attempting to start the vehicle then loose battery connections are indicated.

As previously described, the yellow LED 8 glows where the battery charge is low and the red light glows if the leads are reverse connected.

Once the faulty battery has been checked the source battery which is to charge the faulty battery should then be checked. If the green light glows there will be sufficient charge in the source battery to permit charging of the faulty battery following starting of the vehicle having the fault battery. If there is insufficient charge in the source battery the yellow light will glow. The vehicle having the source battery should be run until such time as to enable the battery to have sufficient charge with the motor vehicle engine stopped.

When the charge in the source battery is sufficient the following procedure should be adopted.

Once the source and faulty batteries have been tested, the device can be used to indicate that the faulty battery has been recharged. In order to do this the jumper leads are connected to the source battery terminals with the positive lead to an electrical point close to the starter motor. The remaining negative lead is connected to an earth point in the fault vehicle at the same time monitoring the indicator lights. If the green light goes out and immediately relights then a boost charge has been transferred to the fault battery. If the green light extinguishes and remains so, then a short circuit in the fault battery is indicated. If the yellow light glows a charge has been transferred to the fault battery but has drained the source battery such that its voltage has dropped below the predetermined maximum operational threshold level. The indicating system allows for constant monitoring of voltage levels in the source battery and fault battery during the charging of the fault battery. This is particularly beneficial in monitoring the charge of the source battery to ensure that it does not fall to a low level (yellow light indicator) during starting of a fault vehicle. In conjunction with the aforesaid monitoring system, the circuit of FIG. 3 also comprises suppression diodes 16 and 17 in device 1 which limit the voltage level generation of voltage spikes or surges to prevent damage to electronic equipment in vehicles with which the device is being used.

It will be recognised by persons skilled in the art that numerous variations and modifications can be made to the present invention as broadly described herein without departing from the overall spirit and scope of the invention.

I claim:

1. A voltage monitoring and transient voltage limiting device adapted for attachment between a power source and a power discharge terminal, the device comprising:
   means for detecting incorrect connection polarity or reverse voltage conditions at the terminals of the power source to which the device is attached, the detecting means including a first series circuit having a resistor, a reverse voltage blocking diode, and a first light emitting diode;
   means for indicating whether the voltage level in the power source is below or at a first predetermined value, the indicating means including a second series circuit having a resistor, a first zener diode, and a second light emitting diode;
   means for limiting of voltage spikes beyond a second predetermined value from the power source; and the means for indicating whether the voltage in the power source is at the first predetermined value further including a voltage measuring circuit, a current limiting resistor, a third light emitting diode, a switching transistor and a second zener diode, the voltage measuring circuit being positioned in parallel with the current limiting resistor, the third light emitting diode, the switching transistor and the second zener diode.

2. A device according to claim 1 wherein at least one of said first, second, and third light emitting diodes is substituted with an acoustic alarm of selected intensity.

3. A device according to claim 1 wherein the said means for limiting voltage spikes comprises at least one voltage suppression device to inhibit or prevent voltage surges through said device from said power source beyond said second predetermined level.

4. A device according to claim 3 characterised in that the said first zener diode limits the turn on voltage of the said first light emitting diode to a value below 12 volts.

5. A device according to claim 4 wherein the said second zener diode limits the turn on voltage of said transistor as part of a voltage divider network.

6. A device according to claim 5 wherein the voltage divider also comprises a variable resistor to set precise turn on voltage of said transistor.

7. A device according to claim 6 wherein the said power source is a motor vehicle battery.

8. A device according to claim 7 wherein said device is encased within a housing having a set of charging leads.

9. A device according to claim 8 characterised in that the device is moulded around and integral with said charging leads.

10. A transient voltage limiting and monitoring device adapted for attachment to at least one charging lead between a power source and a power discharge point also connected to said lead or leads, the device comprising:

a housing containing a monitoring and transient voltage limiting circuit, the housing adapted to receive at least one power cable running between an entry and exit means in said housing;

means for holding said power cable in rigid engagement with said housing when said lead or leads are connected to said power source;

a first indicating means incorporated in said circuit for indicating proper interconnection between said lead or leads at said power source, said indicating means including a series circuit having a first resistor, a reverse voltage blocking diode, and a first light emitting diode;

a second indicating means incorporated in said circuit for indicating that the voltage emanating from said power source falls below a predetermined minimum operational threshold level, the second indicating means including a second series circuit having a second resistor, a first zener diode and a second light emitting diode;

a third indicating means incorporated in said circuit for indicating that the voltage emanating from said power source exceeds the predetermined minimum operational threshold level, the third indicating means including a voltage measuring circuit, a current limiting resistor, a third light emitting diode, a switching transistor, and a second zener diode, the voltage measuring circuit being positioned in parallel with the current limiting resistor, the third light emitting diode, the switching transistor, and the second zener diode; and means for limiting the voltage surges from the power source beyond a second predetermined level.

11. A device according to claim 10 wherein each of said first second and light emitting diodes are substituted with acoustic alarms of selected intensity.

12. A device according to claim 10, wherein said means for limiting voltage surges comprises at least one voltage suppression device to inhibit or prevent voltage spikes between pulses of said device from said power source beyond said second predetermined level.

13. A device according to claim 12 characterised in that the said first zener diode limits the turn on voltage of the said first light emitting diode to a value below 12 volts.

14. A device according to claim 13 wherein the said second zener diode limits the turn on voltage of said transistor as part of a voltage divider network.

15. A device according to claim 14 wherein the voltage divider also comprises a variable resistor to set precise turn on voltage of said transistor.

16. A device according to claim 15 wherein the said power source is a motor vehicle battery.

* * * * *